United States Patent [19]
Paulus et al.

[11] Patent Number: 6,036,883
[45] Date of Patent: Mar. 14, 2000

[54] USE OF LOW MOLECULAR-WEIGHT OR POLYMERIC ORGANIC COMPOUNDS WHICH ARE PRESENT IN THE COLUMNAR-HELICAL PHASE AND HAVE LIQUID-CRYSTALLINE PROPERTIES

[75] Inventors: Wolfgang Paulus, Weisenheim; Lukas Häussling, Bad Dürkheim; Karl Siemensmeyer; Karl-Heinz Etzbach, both of Frankenthal; Dieter Adam, Hof; Juergen Simmerer, Bayreuth; Helmut Ringsdorf; Peter Schuhmacher, both of Mainz; Dietrich Haarer, Bayreuth; Sundeep Kumar, Mainz, all of Germany

[73] Assignee: BASF Aktiengesellschaft, Ludwigshafen, Germany

[21] Appl. No.: 09/082,075

[22] Filed: May 21, 1998

Related U.S. Application Data

[62] Division of application No. 08/776,610, Feb. 20, 1997, Pat. No. 5,798,197, and a continuation of application No. PCT/EP95/03166, Aug. 10, 1995.

[30] Foreign Application Priority Data

Aug. 20, 1994 [DE] Germany ............... 44 29 597

[51] Int. Cl.$^7$ ................... C09K 19/32; C09K 19/54
[52] U.S. Cl. ................... 252/299.62; 252/299.5
[58] Field of Search .................. 252/299.62, 299.5

[56] References Cited

U.S. PATENT DOCUMENTS

| | | |
|---|---|---|
| 4,333,709 | 6/1982 | Dubois et al. ............ 252/299.62 |
| 4,430,650 | 2/1984 | Billard et al. ............ 340/784 |
| 4,631,143 | 12/1986 | Praefcke et al. ............ 252/299.62 |
| 4,865,762 | 9/1989 | Kreuder et al. . |
| 5,370,820 | 12/1994 | Boden et al. . |
| 5,393,626 | 2/1995 | Closs et al. . |
| 5,718,838 | 2/1998 | Okazaki ............ 252/299.01 |
| 5,730,900 | 3/1998 | Kawata ............ 252/299.01 |
| 5,730,903 | 3/1998 | Okazaki ............ 252/299.62 |
| 5,736,068 | 4/1998 | Haeussling et al. ............ 252/299.62 |
| 5,750,050 | 5/1998 | Goodby et al. ............ 252/299.62 |
| 5,855,971 | 1/1999 | Kobori et al. ............ 428/1 |

FOREIGN PATENT DOCUMENTS

| | | |
|---|---|---|
| 0 254 060 A2 | 1/1988 | European Pat. Off. . |
| 0 527 367 A1 | 2/1993 | European Pat. Off. . |
| 2 237 539 | 7/1972 | Germany . |
| 31 10955 A1 | 9/1982 | Germany . |
| 3 346 980 | 7/1985 | Germany . |
| 2 223 493 | 4/1990 | United Kingdom . |

OTHER PUBLICATIONS

"Fourier Transform Infrared Absorption Study of Hexa (Hesylthio) Tryphenylene: A Discotic Liquid Crystal", vol. 115, No. 6, (Aug. 1991), W.K. Lee, et al., p. 839.

"Conductivity and Structure of a Liquid–Crystalline Organic Conductor", vol. 117, No. 14, (Oct. 1992), G. B. M. Vaughn, et al., p. 700.

"Erste Fluessigkristalline Hexakis (Alkylthio) Triphenylene", vol. 108. No. 3 (Mar. 1984), p. 113, B. Kohne, et al.

"Towards A Photodonductive Liquid Crystal: Carbazole Containing Systems", L. L. Chapoy, et al., Mol. Cryst. Liq. Cryst. 1984, vol. 105, pp. 353–374.

"Transient Photoconductivity in a Discotic Liquid Crystal", Physical Review Letters, vol. 70, No. 4, (Jan. 1993), D. Adam, et al.

"Fourier Transform Infrared Absorption Study of Hexa-(Hexylthio)Triphenylene: A Discotic Liquid Crystal", W. K. Lee, et al., Mol. Cryst. Liq. Cryst., vol. 198, pp. 273–284, (1991).

*Primary Examiner*—C. H. Kelly
*Attorney, Agent, or Firm*—Oblon, Spivak, McClelland, Maier & Neustadt, P.C.

[57] ABSTRACT

The use of low molecular-weight or polymeric organic compounds which are present in the columnar-helical phase and have liquid-crystalline properties, as photoconductors or in electronic components, corresponding photoconductive layers, an electrophotographic recording material and a method for enhancing the photoconductivity.

1 Claim, No Drawings

USE OF LOW MOLECULAR-WEIGHT OR POLYMERIC ORGANIC COMPOUNDS WHICH ARE PRESENT IN THE COLUMNAR-HELICAL PHASE AND HAVE LIQUID-CRYSTALLINE PROPERTIES

This application is a division of 08/776 610, filed Feb. 20, 1997, now U.S. Pat. No. 5,798,197, and a continuation of PCT/EP95/03166 filed Aug. 10, 1995.

The invention relates to the use of low molecular-weight or polymeric organic compounds which are present in the columnar-helical phase and have liquid-crystalline properties, as photoconductors or in electronic components, corresponding photoconductive layers, an electrophotographic recording material and a method for enhancing the photoconductivity.

Photoconductive polymers are an interesting class of materials and are used industrially on a large scale in copiers, laser printers and offset printing plates.

A number of attempts to improve the charge transfer characteristics of liquid-crystalline materials by orientation in the liquid-crystalline state are known. There are three approaches to this objective.

Firstly, low molecular-weight liquid-crystallines which form nematic phases at room temperature are doped with carbazole, the absorption capacity of the liquid-crystalline matrix being very limited, however. Even at very low concentrations (a few wt %) the carbazole begins to crystallize. Accordingly, only a small photo-current of the carbazole-doped liquid-crystalline samples is produced (compare L. L. Chapoy, D. K. Munck, K. H. Rasmussen, E. Juul-Diekmann, R. K. Sethi, D. Biddle, in Molecular Crystals, liquid-crystallines, Vol. 105, p. 353 et seq. (1984)).

The second approach is illustrated in EP-A-0 254 060. EP-A-0 254 060 discloses photoconductive films having a thickness of less than 20 μm, which are produced from concentrated lyophase solutions of a polymer which has a repeating unit according to the general formula I,

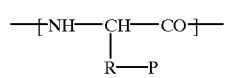
I

R being an alkylene radical having from 1 to 20 carbon atoms and P being a photoconductive group.

The third approach is described in EP-A-0 527 376. This describes low molecular-weight and polymeric organic photoconductors having generally diskotic liquid-crystalline properties with enhanced photoconductivity. A typical representative is hexaalkyloxytriphenylene, which has carrier charge mobilities of almost $10^{-3}$ cm$^2$/Vs (compare D. Adam, F. Closs, T. Frey, D. Funhoff, D. Haarer, H. Ringsdorf, R. Schuhmacher, K. Siemensmeyer, Phys. Rev. Lett., 1993, 70, 457).

It is an object of the present invention to provide organic compounds having liquid-crystalline properties, which in the liquid-crystalline state have an even higher photoconductivity or charge carrier mobility and which are suitable for use as photoconductors or in electronic components.

We have found that this object is achieved by the use of low molecular-weight or polymeric organic compounds which are present in the columnar-helical phase and have liquid-crystalline properties, as photoconductors or in electronic components.

Another object of the invention is a photoconductive layer which comprises a low molecular-weight or polymeric organic compound which is present in the columnar-helical phase and has liquid-crystalline properties.

A further object of the invention is an electrophotographic recording material which comprises an electroconductive base and a photoconductive layer of the abovementioned type.

The organic compounds used according to the invention, which have liquid-crystalline properties, generally have a photoconductivity of greater than $10^{-2}$ cm$^2$/Vs.

Low molecular-weight organic compounds having a columnar-helical phase which are suitable according to the invention include, for example, hexahexylthiotriphenylene and its mixtures with other hexaalkylthio-substituted derivatives, but also otherwise substituted triphenylenes, phthalocyanines, hexasubstituted benzenes, truxenes and hexa- or octasubstituted dibenzopyrenes, which have a columnar-helical phase.

Among these organic compounds triphenylene derivatives are preferred, particular preference in turn being given to triphenylene derivatives which contain thioalkyl substituents. A particularly suitable low molecular-weight organic compound which has a high charge carrier mobility and photoconductivity in a columnar-helical phase is 2,3,6,7,10,11-hexahexylthiotriphenylene.

The synthesis of 2,3,6,7,10,11-hexahexylthiotriphenylene and its columnar-helical phase are described in Molecular Crystals, liquid-crystallines 1991, Vol. 198, pp. 273 to 284.

The invention further relates to triphenylene derivatives of the general formula I, as novel compounds,

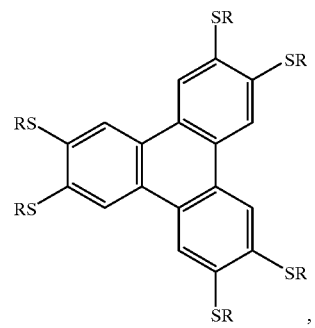
I where the radicals

R are $C_4$- to $C_8$-n-alkyl groups in random distribution.

Among the compounds of formula I, those having $C_5$- and $C_6$-n-alkyl radicals are preferred. The random distribution preferably involves from 70 to 80% of n-hexyl and from 20 to 30% of n-pentyl.

To prepare the compounds containing the randomly distributed alkyl radicals, hexabromotriphenylene can be reacted with suitable mixtures of the $C_4$- to $C_8$-n-alkylthiols, preferably in the form of the alkali metal salts. Details of the reaction can be gathered from the example.

Polymeric organic compounds suitable according to the invention are those which contain photoconductive groups, either in the polymer chain or bound to a polymer chain via a flexible spacer, and have a columnar-helical phase.

According to the invention, low molecular-weight compounds can be employed which contain one or more polymerizable groups which are crosslinked in the columnar-helical phase.

Equally possible is the formation of charge-transfer complexes to generate charge carriers. According to the invention, the low molecular-weight or polymeric organic compounds having liquid-crystalline properties are able to act as electron donors or as electron acceptors in the charge-transfer complexes. As a rule, the said low molecular-weight or polymeric organic compounds having liquid-crystalline properties act as electron donors.

The low molecular-weight or polymeric organic compounds used according to the invention are known per se or can be prepared according to customary methods (compare B. Kohne, W. Poules and K. Praefcke, Chemiker-Zeitung, 108 (1984), No. 3, p. 113; EP-A-0 527 376; U.S. Pat. No. 4,865,762).

The uses according to the invention as a rule involve thin photoconductive layers, in some cases providing the option of separating the charge transfer from the charge generation in the sense of a two-layer arrangement, as used in electrophotography. In this arrangement the photoconductor is situated in the photo-conductive charge transfer layer which is adjoined by a conventional and known sensitizer layer which generates known charge carriers. In this case charging is usually effected via a high-voltage corona.

To enhance the photosensitivity of the photoconductive layers, sensitizers, ie. compounds which generate charge carriers but do not destroy the columnar-helical phase, can be added. Compounds of this type include eg. the perylenetetracarboxylic acid derivatives disclosed by DE-A 22 37 539 and DE-A 31 10 955. Particular preference is given to the addition of liquid-crystalline compounds as charge carrier generators.

The layers according to the invention can be produced on a substrate surface by application of a melt or, in a customary and known manner, eg. by blade-coating a substrate surface with a solution of the compounds. In so doing, the solution may be admixed with various adjuvants, eg. to improve the leveling characteristics. Also suitable are spin-coating and Langmuir-Blodgett techniques.

Solvents used are, for example, tetrahydrofuran or dichloromethane.

These photoconductive layers generally have a layer thickness of between 2 and 100, preferably of between 4 and 50 and particularly preferably between 4 and 30 $\mu$m.

The photoconductors or the photoconductive layers may be sandwiched between conductively coated, transparent substrates, for which glass plates or plates of optically transparent plastics (for example poly(methyl methacrylate), polycarbonate etc.) are used. The conductive coating of the substrate may comprise electroconductive polymers, semiconductors or metals, although the thickness of said coating should be chosen so as not unduly to impair the optical transmittance. Particularly advantageous coatings comprise ITO (indium tin oxide).

To generate a photocurrent, a DC voltage of between 5 and 50 V is then generally applied to the electroconductively coated plates.

The use, according to the invention, as photoconductors involves utilization of the enhanced charge carrier mobility and photoconductivity, whereas the use in electronic components admittedly also involves the utilization of the photoconductivity, but above all of the enhanced charge carrier mobility in the absence of light.

The photoconductors and photoconductive films according to the invention can be used in electrophotography, in laser printers, in offset printing or alternatively in microelectronics for photosensitive switches.

In addition, the novel photoconductive layers can be employed in all those sectors in which the enhanced photoconductivity brought about by an ordered molecular arrangement can be utilized.

According to the invention, the low molecular-weight or polymeric organic compounds which are present in the helical phase and have liquid-crystalline properties can also be used in electronic components, the term electronic components for the purposes of the invention preferentially being intended to refer to those in which the enhanced charge carrier mobility rather than the enhanced photoconductivity is utilized.

The use in electronic components also includes the application in displays.

The application in displays provides the option, according to the invention, of fabricating LEDs (light-emitting diodes), the phenomenon of electroluminescence being utilized. The organic substances which are used according to the invention in the columnar-helical phase are particularly suitable owing to their high chemical stability with respect to electrical fields applied and high temperatures.

A use according to the invention in electronic components comprises the fabrication of organic transistors. Specific examples include field effect transitors (FET) having MOS and MIS structures (MOS: metal oxide semiconductor; MIS: metal insulator semiconductor).

Moreover, the invention can be used in all those electronic components in which the very high charge carrier mobility of the highly ordered columnar-helical phase can be utilized.

The method according to the invention establishes the columnar-helical phase, in which the photoconductivity is higher than in the disordered state. This can be done in various ways. The orientation can, for example, be achieved mechanically (by stretching or shearing) or by electric or magnetic fields. An orientation can also be established by means of orienting underlying layers which eg. include polyimides or are made therefrom. The simplest option is a thermal treatment (tempering).

The present invention has numerous advantages. The low molecular-weight or polymeric organic compounds in the columnar-helical phase exhibit the high charge carrier mobilities of organic single crystals (eg. of anthracene). Because these organic compounds are easier to orientate than organic single crystals, their preparation is considerably simpler, however.

EXAMPLES

Example 1 is an example for photoconductors according to the invention and the method according to the invention for enhancing the photoconductivity. Comparative Example 1 describes a known photoconductor. Example 2 relates to the use in organic transistors.

In Example 1, the organic photoconductor was studied as follows.

The organic photoconductors were sandwiched between two electro-conductively coated transparent glass plates of a glass measuring cell.

The spacing of the glass plates was adjusted between 5 and 15 $\mu$m by means of spacers. Via the conductive layer a voltage was applied to the sample and the current was measured.

For measuring purposes, the glass measuring cell containing the sample layer to be studied was located in a microscope heating stage, whose temperature could be regulated, via a heating control system, from room temperature to 300° C. at constant heating rates. In a direction perpendicular to the sample surface, the cell was irradiated (intensity about 0.02 watt/cm$^2$) by a halogen incandescent lamp through a window in the heating stage cover having a diameter of about 5 mm. The incident light beam was modulated by a chopper with a frequency of 10 Hz, ie. cut up into light pulses having a duration of 50 msec with dark phases of equal duration.

Via its two contact electrodes (transparent ITO electrodes) the measuring cell was connected in series with a picoameter to a variable-voltage source. This was used to apply 10 V of DC voltage to the measuring cell. The picoameter measured the electric current thus generated through the sample, ie. at the light modulation frequency alternately measured the dark current during the dark phase of the illumination, and the sum of dark current and photocurrent during the light phase.

The analog output signal of the picoameter was fed to a lock-in amplifier whose reference frequency was provided by the chopper. Here, that fraction of the voltage of the picoameter output was measured which changed with the modulation frequency. The voltage fraction was directly proportional to the difference of the measured cell current in the light phase and dark phase, respectively, of the exposure to light and was thus proportional to the photocurrent.

Thus to measure the photocurrent as a function of temperature, the measuring cell was heated in the heating stage at a heating rate of 5° C./min until the isotropic state was reached. During this temperature cycle the above-described measuring electronics were active. The reading of the lock-in amplifier could be read off at the instrument as a function of the temperature and be converted into units of photocurrent.

The experimental values found are shown in the tables.

Example 1

2,3,6,7,10,11-Hexahexylthiotriphenylene (H6ST) which had been purified by repeated recrystallization was sandwiched in the melt between the two electroconductively treated transparent glass plates of the glass measuring cell (layer thickness: 32.1 μm), and the photocurrent was measured as described during cooling down to 314 K. The experimental values found for the charge carrier mobility in the columnar-helical phase (H) are shown in Table 1.

Comparative Example 1

Table 2 describes the experimental values for 2,3,6,7,10,11-hexapentyloxytriphenylene (HPT) in the diskotic-columnar liquid-crystalline phase ($D_{ho}$). In this case, the charge carrier mobility during heating to 383 K was measured (layer thickness: 1.21 μM).

The maximum charge carrier mobilities of the two substances differ in that the H6ST has a charge carrier mobility which is 2 orders of magnitude higher than that of HPT.

TABLE 1

| ($E = 2.0 \cdot 10^4$ V/cm, d = 32.1 μm, λ = 337 nm) | | |
|---|---|---|
| Phase | T (K) | $\mu(\text{cm}^2/\text{V}_s)$ |
| I | 372 | $9.9 \cdot 10^{-5}$ |
|  | 367 | $9.6 \cdot 10^{-5}$ |
|  | 365 | $9.4 \cdot 10^{-5}$ |
| $D_h$ | 363 | $1.1 \cdot 10^{-3}$ |
|  | 358 | $1.4 \cdot 10^{-3}$ |
|  | 352 | $1.9 \cdot 10^{-3}$ |
|  | 349 | $2.5 \cdot 10^{-3}$ |
|  | 346 | $3.4 \cdot 10^{-3}$ |
|  | 342 | $4.8 \cdot 10^{-3}$ |
| H | 340 | $7.2 \cdot 10^{-2}$ |
|  | 338 | $7.7 \cdot 10^{-2}$ |
|  | 334 | $7.6 \cdot 10^{-2}$ |

TABLE 2

| ($E = 4.0 \cdot 10^4$ V/cm, d = 12.1 μm, λ = 337 nm) | | |
|---|---|---|
| Phase | T (K) | $\mu(\text{cm}^2/\text{V}_s)$ |
| $D_h$ | 344 | $7.6 \cdot 10^{-4}$ |
|  | 350 | $7.5 \cdot 10^{-4}$ |
|  | 356 | $7.6 \cdot 10^{-4}$ |
|  | 362 | $7.4 \cdot 10^{-4}$ |
|  | 369 | $7.7 \cdot 10^{-4}$ |
|  | 375 | $7.1 \cdot 10^{-4}$ |
|  | 383 | $6.1 \cdot 10^{-4}$ |

Example 2

Randomly substituted hexyl- and pentylthiotriphenylene

A mixture of 4.04 g (0.342 mol) of 1-hexylmercaptan and 3.56 g (0.342 mol) of 1-pentylmercaptan is heated with 8.4 g (0.688 mol) of potassium t-butylate in 50 ml of N-methylpyrrolidone to 70° C. for 10 minutes. After the addition of 4.0 g (0.0057 mol) of 2,3,6,7,10,11-hexabromotriphenylene, the reaction mixture is stirred under nitrogen at 70° C. for 30 minutes, then cooled to room temperature and poured into water. The precipitate is filtered off with suction, washed with methanol and purified by means of column chromatography. The reaction product was characterized by means of $^1$H-NMR spectroscopy (the position of the signals is identical to those of hexahexylthiotriphenylene, but the integrals which define the ratio of the alkyl chain lengths are different).

Yield: 4.8 g (95%)

Phase behavior: crystalline, at 53° C. helical diskotic-columnar phase, at 83° C. diskotic-columnar phase ($D_{ho}$), at 89° C. isotropic.

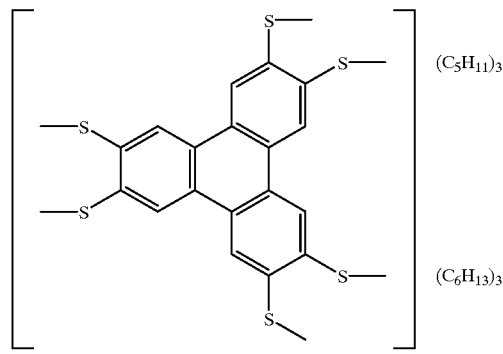

Example 3

Transistor having a MOSFET structure

On top of a silicon wafer having a thickness of 300 μm, an n-type silicon layer having a thickness of 400 nm was applied as a gate electrode. On top of this, a silicon dioxide layer having a thickness of 200 nm was applied as an insulator. On top of this, a liquid-crystalline layer of 2,3,6,7,10,11-hexahexylthiotriphenylene was then applied in a thickness of from 5 to 10 monolayers by the Langmuir-Blodgett technique. Thus very good orientation of the columns, which are present in the liquid crystal layer, could be achieved in a source-drain direction. Then the source and drain electrodes (each made of gold) were vapor-deposited onto the liquid crystal layer. The width of the channel was from 0.05 to 0.1 mm, and the length of the channel from 10 to 50 mm. The gate contact consisted of a Ga-In alloy. The analysis of the characteristic curves demonstrated that the liquid crystal layer of 2,3,6,7,10,11-hexahexylthiotriphenylene was suitable for use in transistors.

We claim:

1. A composition comprising at least two hexa substituted triphenylene compounds, wherein each compound has the general formula

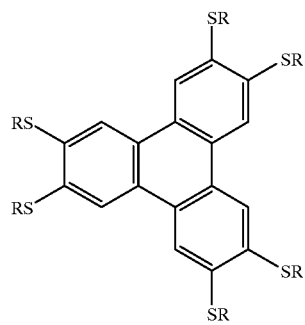

wherein each R group is an n-butyl group, an n-pentyl group, an n-hexyl group, an n-heptyl group, or an n-octyl group, wherein 20 to 30% of the total number of R groups of the compounds are n-pentyl groups, and 70 to 80% of the total number of R groups of the compounds are n-hexyl groups.

* * * * *